United States Patent
Zhang et al.

(10) Patent No.: US 8,877,633 B2
(45) Date of Patent: Nov. 4, 2014

(54) METHODS OF FORMING A BARRIER SYSTEM CONTAINING AN ALLOY OF METALS INTRODUCED INTO THE BARRIER SYSTEM, AND AN INTEGRATED CIRCUIT PRODUCT CONTAINING SUCH A BARRIER SYSTEM

(71) Applicant: GLOBALFOUNDRIES Inc., Grand Cayman (KY)

(72) Inventors: Xunyuan Zhang, Albany, NY (US); Hoon Kim, Guilderland, NY (US); Vivian W. Ryan, Berne, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/852,084

(22) Filed: Mar. 28, 2013

(65) Prior Publication Data

US 2014/0291847 A1    Oct. 2, 2014

(51) Int. Cl.
*H01L 21/4763* (2006.01)
*H01L 21/768* (2006.01)
*H01L 23/532* (2006.01)
*H01L 23/522* (2006.01)

(52) U.S. Cl.
CPC .... *H01L 21/76843* (2013.01); *H01L 23/53223* (2013.01); *H01L 23/53266* (2013.01); *H01L 23/5226* (2013.01); *H01L 23/53219* (2013.01); *H01L 23/53261* (2013.01); *H01L 23/53214* (2013.01); *H01L 23/53252* (2013.01)

USPC ................... 438/627; 438/653; 438/643

(58) Field of Classification Search
CPC ........................................... H01L 21/00
USPC .......................... 438/627, 653, 643
See application file for complete search history.

(56) References Cited

U.S. PATENT DOCUMENTS

| | | | |
|---|---|---|---|
| 2002/0005519 A1* | 1/2002 | Muramatsu et al. | 257/70 |
| 2003/0094611 A1* | 5/2003 | Hayakawa | 257/49 |
| 2005/0054191 A1* | 3/2005 | Yu et al. | 438/629 |
| 2007/0228374 A1* | 10/2007 | Hayakawa | 257/55 |
| 2011/0034009 A1* | 2/2011 | Hayakawa | 438/487 |
| 2012/0263869 A1* | 10/2012 | Ivanov | 427/123 |
| 2014/0021613 A1* | 1/2014 | Ryan et al. | 257/751 |

* cited by examiner

*Primary Examiner* — Telly Green
(74) *Attorney, Agent, or Firm* — Amerson Law Firm, PLLC

(57) ABSTRACT

One illustrative method disclosed herein includes forming a trench/via in a layer of insulating material, forming a barrier system comprised of at least one barrier material and at least two metallic elements, and performing a heating process to form a metal alloy comprised of the at least two metallic elements in the barrier system. Also disclosed is a device that comprises a trench/via in a layer of insulating material, a barrier system positioned in the trench/via, wherein the barrier system comprises at least one barrier material and a metal alloy comprised of at least two metallic elements that are comprised of materials other than the at least one barrier material, and a conductive structure positioned in the trench/via above the barrier system.

27 Claims, 4 Drawing Sheets

METHODS OF FORMING A BARRIER SYSTEM CONTAINING AN ALLOY OF METALS INTRODUCED INTO THE BARRIER SYSTEM, AND AN INTEGRATED CIRCUIT PRODUCT CONTAINING SUCH A BARRIER SYSTEM

BACKGROUND OF THE INVENTION

1. Field of the Invention

Generally, the present disclosure relates to the manufacture of semiconductor devices, and, more specifically, to various methods of forming a barrier system on an integrated circuit product wherein the barrier system includes alloyed compounds of metals that were introduced into the basic barrier system, and an integrated circuit product containing such a barrier system.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while interlevel (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing cross-talk as compared to other dielectric materials with higher dielectric constants. However, the use of such low-k dielectric materials can be problematic as they tend to be less resistant to metal migration as compared to some other dielectric materials.

Copper is a material that is difficult to directly etch using traditional masking and etching techniques. Thus, conductive copper structures, e.g., conductive lines or vias, in modern integrated circuit devices are typically formed using known single or dual damascene techniques. FIGS. 1A-1B depict one illustrative prior art technique for forming a conductive copper structure. In general, the damascene technique involves: (1) forming one or more trenches/vias 12 in a layer of insulating material 14; (2) depositing one or more relatively thin barrier layers 16 (e.g., TiN, TaN); (3) forming an adhesion or wetting layer 18 (e.g., tantalum, ruthenium, cobalt, etc.) on the barrier layer 16; (4) forming a copper seed layer (not shown) comprised of, for example, pure copper, copper-manganese, copper-aluminum, etc.; (5) forming a bulk copper material 20 across the substrate and in the trenches/vias 12; and (6) performing a chemical mechanical polishing process to remove the excess portions of the barrier layer 16, the adhesion layer 18 and the copper material 20 positioned outside of the trenches/vias 12 to define the illustrative final conductive copper structures 22 depicted in FIG. 1B. As is well known to those skilled in the art, the copper material 20 is typically formed by performing an electro-chemical copper deposition process after a thin conductive copper seed layer (not shown in FIG. 1A) is deposited by physical vapor deposition on the adhesion layer 18.

However, as everything becomes more crowded on an integrated circuit product, problems may arise when manufacturing conductive structures employing traditional damascene techniques. More specifically, in conventional processing, the barrier layer 16, the adhesion layer 18 and the copper seed layer (not shown) all are formed as continuous individual layers, and the barrier layer 16 and the adhesion layer 18 are typically made of materials that are less conductive than copper. As the overall size of the conductive structure is reduced, the barrier layer 16 and the adhesion layer 18 occupy an increasing proportion of the space allowed for the overall conductive structure. Accordingly, the electrical resistance of the overall conductive structure increases. Additionally, the uniform barrier layers and liner layers used in high performance integrated circuit products are being manufactured to very small thicknesses that are about at the limits of the production equipment, i.e., it is difficult to continue to reduce the thickness of the barrier layers and the adhesion layers and still have them function as diffusion barriers and adhesion promoters. Another problem encountered in manufacturing conductive structures using existing techniques is that the various anneals that are performed on the barrier layer 16 may result in the formation of so-called "open-pipe" copper diffusion paths in the barrier layer, and such anneals may weaken the interface between the barrier layer 16 and the layer of insulating material 14. Simply put, that anneal of the barrier layer 16 may cause uncontrolled recovery and recrystallization of the microstructure of the material of the barrier layer 16. In some situations, semiconductor manufacturers have started to use materials such as ruthenium or cobalt as the adhesion layer 18 to facilitate copper filling of the trench/via 12. While the use of ruthenium/cobalt tends to result in improved copper-filling characteristics, their use as an adhesion layer material is not without problems. For example, ruthenium typically causes a pseudo-corrosive reaction with tantalum, a common material in barrier layers. In turn, such a reaction may cause an undesirable increase in the resistance of the conductive structure, create open pathways in the barrier layer and generally degrade the overall quality of the barrier layer.

The present disclosure is directed to various methods of forming a barrier system on an integrated circuit product wherein the barrier system includes alloyed compounds of metals that were introduced into the basic barrier system, and an integrated circuit product containing such a barrier system that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a barrier layer on an integrated circuit product wherein the barrier layer includes alloyed compounds of metals that were introduced into the basic barrier layer, and an integrated circuit product containing such a barrier layer. One illustrative method disclosed herein includes forming a trench/via in a layer of insulating material, forming a barrier system comprised of at least one barrier material and at least two metallic elements, and performing a heating process to form a metal alloy comprised of the at least two metallic elements in the barrier system. In some applications, the two metallic elements may be comprised of elements that are different than the barrier material.

Another illustrative method disclosed herein includes forming a trench/via in a layer of insulating material, forming a barrier layer comprised of a barrier layer material and at least two metallic species, and performing at least one heating process to form a metal alloy comprised of the at least two metallic species in the barrier layer. In some applications, the two metallic elements may be comprised of elements that are different than the barrier layer material.

Yet another illustrative method disclosed herein includes forming a trench/via in a layer of insulating material, forming a first barrier layer, forming a second barrier layer on the first barrier layer, wherein the first and second barrier layers are comprised of first and second barrier layer materials, respectively, and wherein, considered collectively, the first and second barrier layers are comprised of at least two metallic elements, and performing at least one heating process to form a metal alloy comprised of the at least two metallic elements in at least one of the first and second barrier layers. In some applications, the two metallic elements may be comprised of elements that are different than the first and second barrier layer materials.

One illustrative conductive structure for an integrated circuit product disclosed herein includes a trench/via in a layer of insulating material, a barrier system positioned in the trench/via, wherein the barrier system comprises at least one barrier material and a metal alloy comprised of at least two metallic elements that are comprised of materials other than the at least one barrier material, and a conductive structure positioned in the trench/via above the barrier system.

BRIEF DESCRIPTION OF THE DRAWINGS

The disclosure may be understood by reference to the following description taken in conjunction with the accompanying drawings, in which like reference numerals identify like elements, and in which.

Figure 1A:
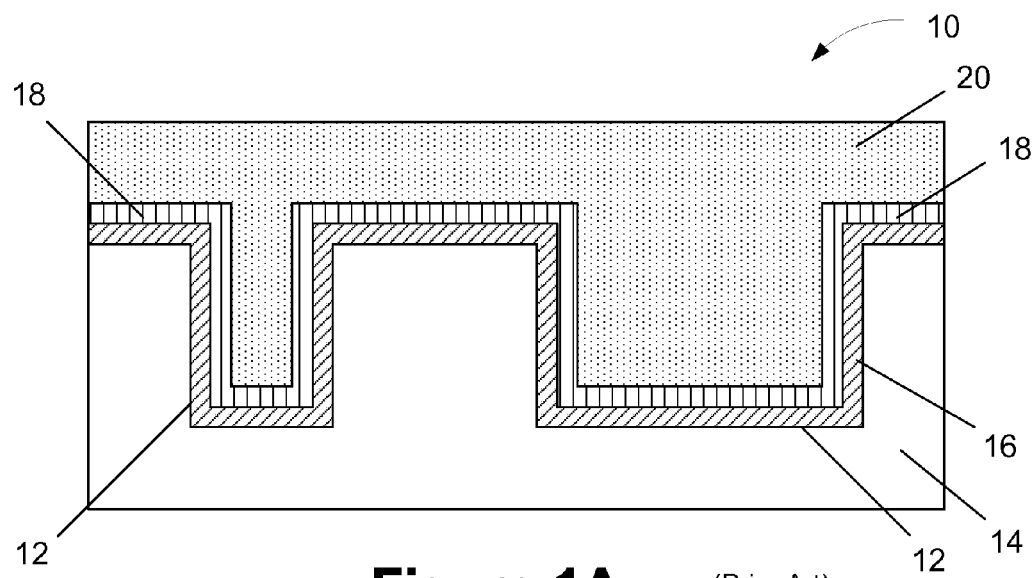
FIGS. 1A-1B depict an illustrative prior art method of forming conductive structures using a damascene process.
Figure 1B:
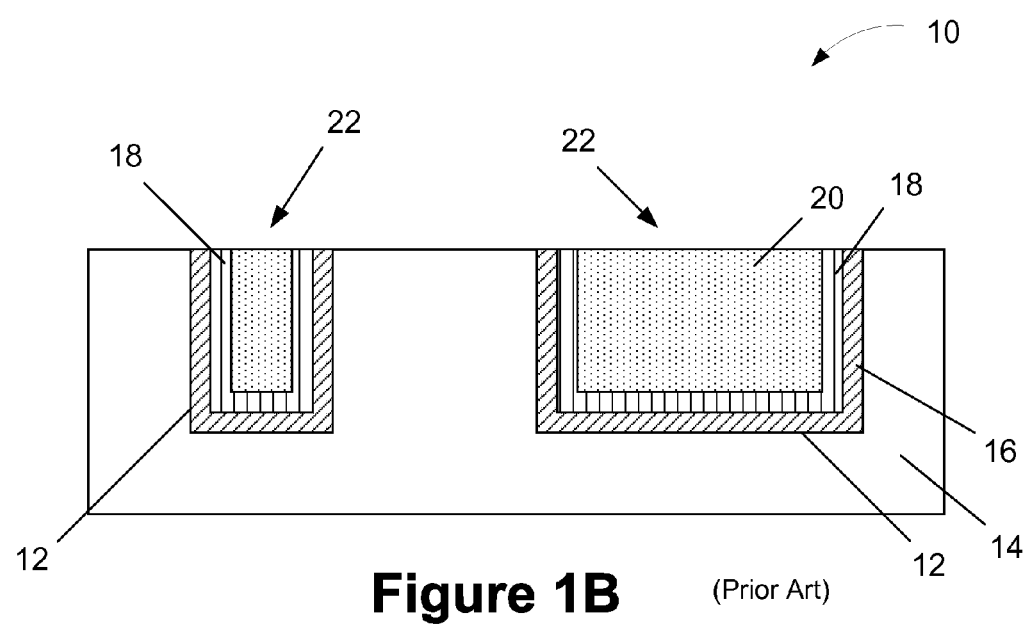

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a barrier system on an integrated circuit product wherein the barrier system includes alloyed compounds of metals that were introduced into the basic barrier system, and an integrated circuit product containing such a barrier system. As will be readily apparent to those skilled in the art upon a complete reading of the present application, the methods and devices disclosed herein may be used in connection with a variety of technologies, e.g., NFET, PFET, CMOS, etc., and they may be readily employed in manufacturing a variety of different devices, including, but not limited to, ASIC's, logic devices, memory devices, etc. With reference to the attached drawings, various illustrative embodiments of the methods and devices disclosed herein will now be described in more detail.

Figure 2A:
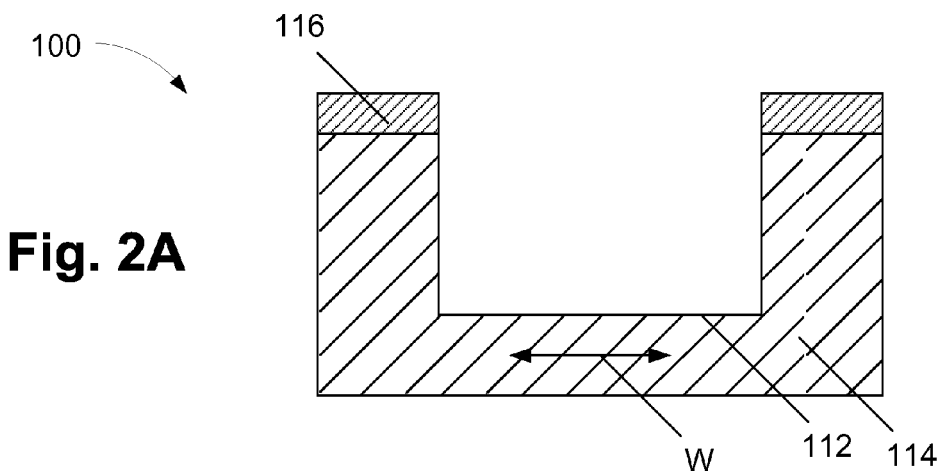
FIGS. 2A-2H depict various illustrative examples of the methods disclosed herein for forming a barrier system that includes alloyed compounds of metals that were introduced into the basic barrier system, and an integrated circuit product containing such a barrier system.

In general, the subject matter disclosed herein is directed to the formation of a barrier system for use in forming conductive structures on integrated circuit products. The barrier system may be comprised of one or more individual barrier layers. A metal alloy is formed in the barrier system. In some applications, the metal alloy may be formed in each of the layers of barrier material that comprise the barrier system. The metal alloy is comprised of metal elements that are different from the materials used to form the basic barrier layers or layer. As described more fully below, in one illustrative example, the barrier system may be comprised of ruthenium or cobalt and the metal alloy may be an aluminum-manganese alloy. The metal elements may be introduced into the barrier system using a variety of techniques, e.g., in situ doping, plasma doping, ion implantation, etc. A heating process is performed to form the metal alloy. The relative sizes of the barrier layers shown herein are enlarged to facilitate explanation of the various novel inventions disclosed herein FIG. 2A is a simplified view of an illustrative integrated circuit product or device 100 at an early stage of manufacturing that is formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a conductive line or via, commonly found on integrated circuit devices.

At the point of fabrication depicted in FIG. 2A, a trench/via 112 has been formed in a layer of insulating material 114 by performing known photolithography and etching techniques through a patterned mask layer 116. FIG. 2A is a cross-sectional view taken across the width (W) of the trench/via 112. The trench/via 112 is intended to be representative of any type of opening formed in any type of insulating material 114 wherein a conductive structure, e.g., a copper-based structure, may be formed. The trench/via 112 may be of any desired shape, depth, width, length or configuration. For example, in some embodiments, the trench/via 112 is a classic trench that does not extend all of the way through to an underlying layer of material, such as the illustrative trench 112 depicted in FIG. 2A. In other embodiments, the trench/via 112 may be a through-hole type feature, e.g., a classic via, that extends all of the way through the layer of insulating material 114 and exposes an underlying layer of material or an underlying conductive structure (not shown), such as an underlying metal line. Thus, the shape, size, depth, length, width or configuration of the trench/via 112 should not be considered to be a limitation of the presently disclosed inventions. The trench/via 112 may be formed by performing any of a variety of different etching processes, e.g., a dry reactive ion etching process, through the patterned mask layer 116. The patterned mask layer 116 may be comprised of a variety of different materials, e.g., silicon nitride.

The various components and structures of the device 100 may be initially formed using a variety of different materials and by performing a variety of known techniques. For example, the layer of insulating material 114 may be comprised of any type of insulating material, e.g., silicon dioxide, a low-k insulating material (k value less than 3.0), etc., it may be formed to any desired thickness and it may be formed by performing, for example, a chemical vapor deposition (CVD) process, atomic layer deposition (ALD) process, a spin-on deposition (SOD) process, etc.

Figure 2B:
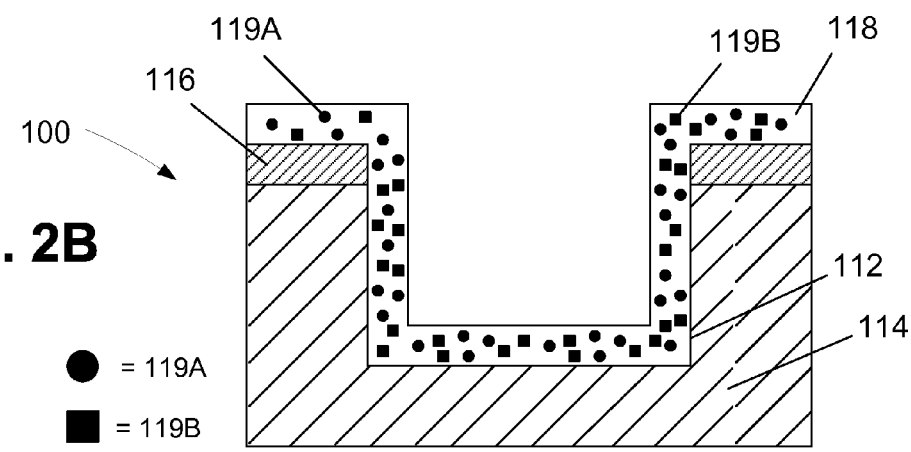

As noted above, the barrier system disclosed herein may be formed of one or more layers of barrier material. As shown in FIG. 2B, a deposition process, e.g., a conformal CVD or ALD process, is performed to form a schematically depicted barrier layer 118 across the product 100 and in the trench/via 112. In one illustrative embodiment, the barrier layer 118 is formed on all surfaces of the layer of insulating material 114 that were exposed when the trench/via 112 was formed. However, in some applications, another liner layer of material (not shown) may be formed between the depicted barrier layer 118 and the layer of insulating material 114. The barrier layer 118 may be comprised of a variety of materials, e.g., metal or metal-containing materials such as ruthenium, cobalt, tungsten nitride, tantalum, tantalum nitride, molybdenum, rhodium, etc. The thickness of the barrier layer 118 may vary depending upon the particular application, e.g., it may have a thickness of about 0.5-4 nm.

In general, the methods disclosed herein involve introducing at least two metallic elements into the material(s) of the barrier system, wherein the metallic elements may, in some cases, be comprised of materials other than the materials used for the layers or layer of the barrier system. In other cases, the metallic elements may be a metallic element that is also present in the layer or layers of the barrier system, but perhaps in a different microstructure form. Thus, FIG. 2B schematically depicts two illustrative separate metallic elements 119A and 119B that are positioned in the barrier layer 118. The metallic element 119A is depicted by circles, whereas the metallic element 119B is depicted by squares. The concentration or amount of the metallic elements 119A/119B in the barrier system may vary depending upon the particular application. For example, in one embodiment, the total amount of the metallic elements 119A/119B should be no more than about 50% (atomic percent) of the overall barrier system material(s) so as not to degrade the film properties of the barrier layer(s) 118. The metallic elements 119A/119B may be comprised of a variety of different materials, e.g., aluminum, manganese, zinc, silver, magnesium, calcium, hafnium, etc. The relative concentration of the metallic elements 119A/119B may vary depending on the particular application and the materials used for the metallic elements 119A/119B. In general, the relative concentration of the metallic elements 119A/119B should be such that they readily form a metal alloy when subjected to a heating process, as described more fully below. As used herein and in the attached claims, the term "metal alloy" should be understood to include a formal alloy, a metastable or even a composite of the metallic elements 119A/119B. In one illustrative example where the metallic elements 119A/119B are comprised of aluminum and manganese, respectively, the ratio between the elements may fall within a range of about 6:1-11:4.

The metallic elements 119A/119B may be introduced into the barrier system material(s) using a variety of techniques. In one illustrative embodiment, the metallic elements 119A/119B may be introduced into the barrier layer 118 while it is being formed, e.g., in situ doping. In one particular embodiment, non-oxygen containing precursor gases should be used in forming the barrier layer 118 during such an in situ doping process such that the metallic elements 119A/119B will not react with the oxygen in the precursor gases. In one illustrative example where the metallic elements 119A/119B are comprised of aluminum and manganese, aluminum chloride, hydrocarbon aluminum, hydrocarbon manganese, a carbonyl-based aluminum or manganese and/or a manganese-based amidinate may be used as precursor gases. In another illustrative example, after the barrier layer 118 is initially formed, the metallic elements 119A/119B may be introduced by performing one or more plasma doping processes or ion implantation processes or by a PVD process (by performing a co-sputtering process or by using a composite target).

Figure 2C:
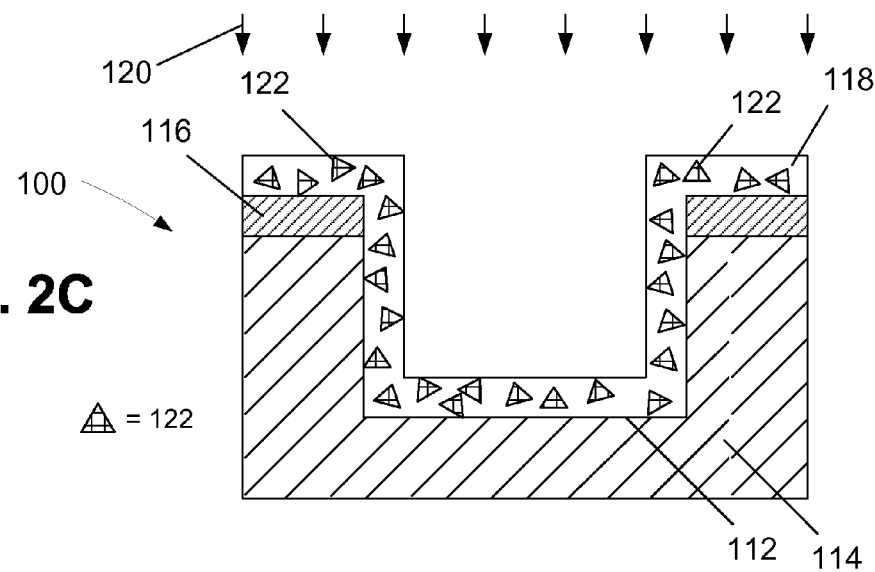

As shown in FIG. 2C, an illustrative heating process 120 is performed to cause the metallic elements 119A/119B to form a plurality of metal alloy structures 122 in the barrier layer 118. In the attached drawings, the metal alloy is depicted as being triangular in shape. In one illustrative example, the heating process 120 may be performed at a temperature that falls within the range of about 50-450° C. in an oxygen-free vacuum, depending upon the materials selected for the metallic elements 119A/119B and the barrier layer(s). The crystalline metal alloy structures 122 will form at the grain boundaries of the barrier system materials and tend to block diffusion of copper and oxygen.

Figure 2D:
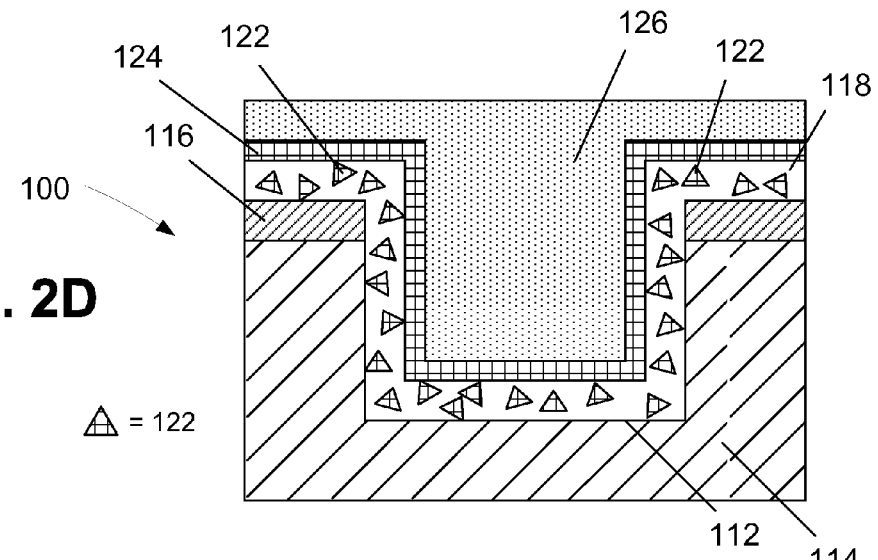

FIG. 2D depicts the product after several process operations were performed on the product 100 so as to ultimately form a conductive structure in the trench/via 112. For example, in one embodiment, forming such a conductive structure may involve forming a copper or copper alloy seed layer 124 e.g., substantially pure copper, copper-manganese, copper-aluminum, copper-gold, etc., on the barrier layer 118, and thereafter forming bulk copper or copper-based alloy material 126 so as to overfill the trench/via 112 using any of a variety of well-known processes, e.g., electroplating, electroless deposition, copper reflow, etc. In the example depicted in FIG. 2D, the copper seed layer 124 is depicted as being in contact with the barrier layer 118. However, in some applications, another liner layer of material (not shown) may be formed between the depicted barrier layer 118 and the copper seed layer 124.

Figure 2E:
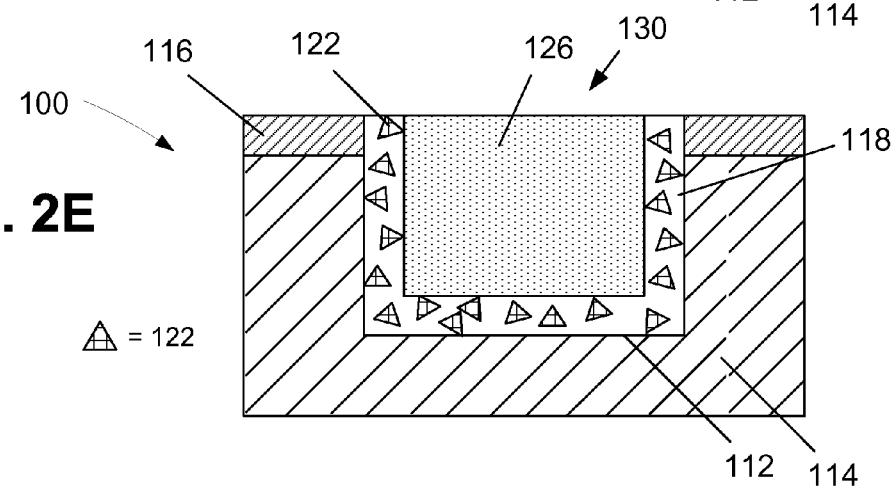

FIG. 2E depicts the product 100 after one or more CMP processes were performed to remove excess materials positioned above the surface of the layer of insulating material 114 and outside of the trench/via 112. These process operations result in the illustrative conductive structure 130. The copper seed layer 124 is not separately depicted in FIG. 2E because, in a real-world device, the copper-seed layer 124 tends to merge with the bulk-copper material 126 when it is deposited. The copper seed layer 124 was shown in FIG. 2D for purposes of explanation only.

Figure 2F:
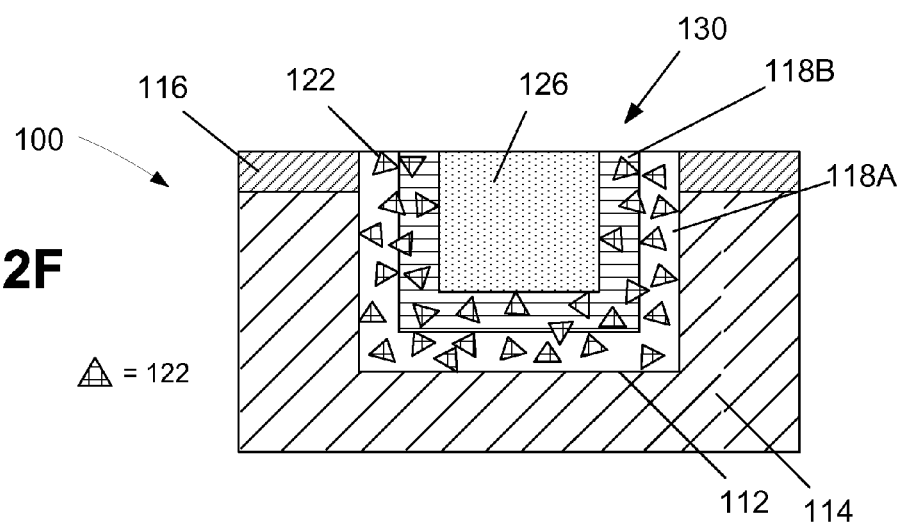
Figure 2G:
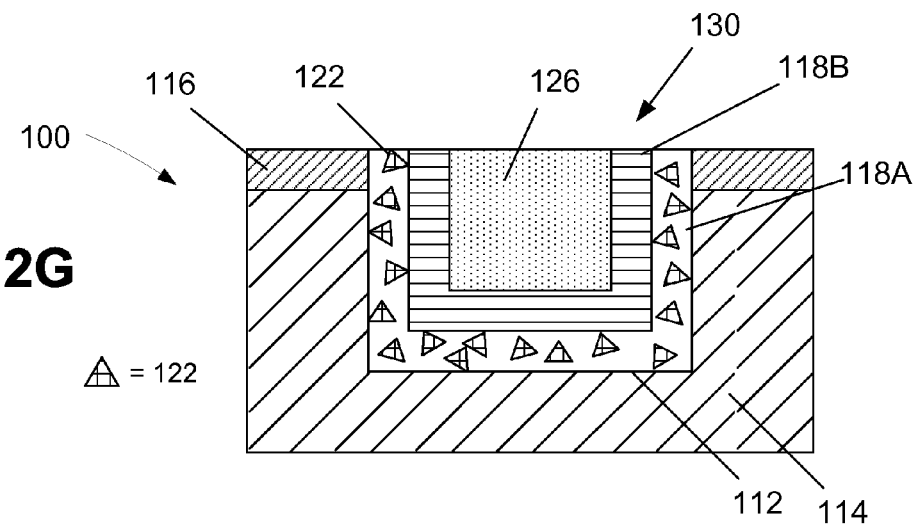
Figure 2H:
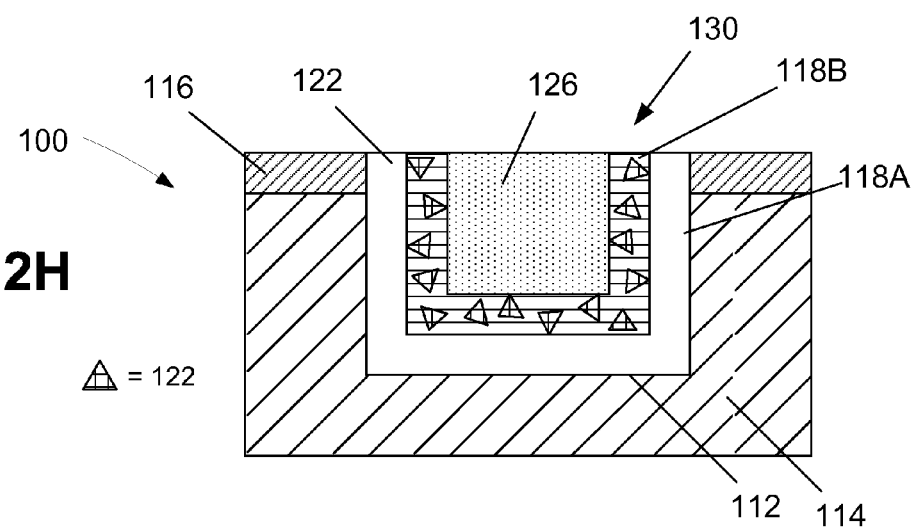

As mentioned above, the barrier system disclosed herein may be formed by forming multiple layers of barrier material. FIG. 2F depicts an illustrative example wherein the barrier system is comprised of first and second barrier layers 118A, 118B. In other applications, more than two barrier layers may be formed. One or both of the barrier layers 118A, 118B may be formed so as to contain the illustrative metal alloy structures 122 described above. That is, considered collectively, the first and second barrier layers 118A, 118B are comprised of the above-described metallic elements 119A/119B and, after performing one or more of the heating processes 120 described above, the metal alloy structures 122 are positioned in one or both of the first and second barrier layers 118A, 118B. In one specific example, shown in FIG. 2F, both of the first and second barrier layers 118A, 118B are formed so as to include both of the metallic elements 119A/119B and the metal alloy structures 122. In another example, one of the barrier layers, e.g., layer 118A, is formed so as to include one of the metallic elements 119A/119B, e.g., element 119A, while the other barrier layer 118B is formed so as to contain the metallic element 119B, or vice-versa. In still other embodiments, as shown in FIG. 2G, only the first barrier layer 118A is formed so as to include both of the metallic elements 119A/119B and the metal alloy structures 122. In even further embodiments, as shown in FIG. 2H, only the second barrier layer 118B is formed so as to include both of the metallic elements 119A/119B and the metal alloy structures 122.

The heating process described above may be performed after each of the barrier layers 118A, 118B is formed or it may be delayed until after the final barrier layer 118B is formed. Irrespective of the techniques involved, after the heating process(es) 120 are performed, the metal alloy structures 122 will be positioned throughout most, if not all, of the barrier system, i.e., the barrier layers 118A, 118B. In the depicted example, the barrier layer 118A is depicted as being formed on the layer of insulating material 114. However, as noted above, there may be a liner layer (not shown) positioned between the barrier layer 118A and the layer of insulating material 114. Similarly, the copper material 126 is depicted as being in contact with the barrier layer 118B. However, in some applications, another liner layer of material (not shown) may be formed between the depicted barrier layer 118B and the copper material.

In one particular embodiment, the barrier system disclosed herein may be comprised of a single layer of material, e.g., a wetting material, such as cobalt or ruthenium, and a plurality of metal-alloy structures that act to block copper and/or oxygen diffusion while not adversely affecting the desired properties of the wetting material layer. Thus, using the novel methods disclosed herein, a single layer may be formed to replace the classic dual layer structure, e.g., a barrier layer plus an adhesion layer that is commonly employed in manufacturing conductive structures for integrated circuit products. Accordingly, in some applications, the methods and devices disclosed herein allow for formation of conductive structures, e.g., conductive lines or vias, wherein a larger portion of the conductive structure is filled with a more conductive material, e.g., copper, in the space saved using the illustrative single layer approach described herein. Alternatively, even where the methods disclosed herein involve the formation of a multiple layer barrier system, the multiple layers may be formed thin enough such that space saving is still achieved while providing the necessary barrier and wetting capabilities desired for the formation of the conductive structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a trench/via in a layer of insulating material;
   forming a barrier system comprised of at least one barrier material and at least two metallic elements comprised of materials other than said at least one barrier material; and
   performing at least one heating process to form a plurality of crystalline metal alloy structures comprised of said at least two metallic elements at grain boundaries of said barrier system.

2. The method of claim 1, further comprising forming a conductive structure in at least said trench/via above said barrier system comprised of said crystalline metal alloy structures.

3. The method of claim 1, wherein said barrier system is formed on said layer of insulating material within said trench/via.

4. The method of claim 3, further comprising forming a conductive structure in at least said trench/via on said barrier system comprised of said crystalline metal alloy structures.

5. The method of claim 1, wherein said barrier system is comprised of at least one of ruthenium, cobalt, tungsten nitride, tantalum, tantalum nitride, molybdenum or rhodium and wherein said at least two metallic elements are selected from the following group: aluminum, manganese, zinc, silver, magnesium, calcium and hafnium.

6. The method of claim 1, wherein said barrier system is comprised of a single layer of barrier material.

7. The method of claim 1, wherein said barrier system is comprised of at least two barrier layers comprised of different barrier materials.

8. The method of claim 1, wherein forming said barrier system comprises performing at least one deposition process to form said barrier system and introducing said at least two metallic elements during said at least one deposition process.

9. The method of claim 8, wherein introducing said at least two metallic elements during said at least one deposition process comprises introducing said at least two metallic elements by using non-oxygen containing precursors during said at least one deposition process.

10. The method of claim 1, wherein forming said barrier system comprises:
    performing at least one deposition process to form said barrier system comprised of said at least one barrier material; and
    after performing said at least one deposition process, performing at least one process operation to introduce said at least two metallic elements into said barrier system comprised of said at least one barrier material.

11. The method of claim 10, wherein performing said at least one process operation comprises performing at least one plasma doping process.

12. The method of claim 10, wherein performing said at least one process operation comprises performing at least one ion implantation process.

13. The method of claim 1, wherein said at least one heating process is performed at a temperature that falls within the range of 50-450° C.

14. The method of claim 1, wherein said at least one barrier system material is comprised of at least one of ruthenium, cobalt, tungsten nitride, tantalum, tantalum nitride, molybdenum or rhodium.

15. The method of claim 1, wherein said at least two metallic elements are selected from the following group: aluminum, manganese, zinc, silver, magnesium, calcium and hafnium.

16. The method of claim 2, wherein said conductive structure is comprised of copper.

17. A method, comprising:
    forming a trench/via in a layer of insulating material;
    forming a barrier system comprised of at least one barrier material and at least two metallic elements; and
    performing at least one heating process to form a plurality of crystalline metal alloy structures comprised of said at least two metallic elements at grain boundaries of said barrier system.

18. The method of claim 17, further comprising forming a conductive structure in at least said trench/via above said barrier system comprised of said crystalline metal alloy structures.

19. The method of claim 17, wherein said barrier system is formed on said layer of insulating material.

20. The method of claim 17, further comprising forming a conductive structure in at least said trench/via on said barrier system comprised of said crystalline metal alloy structures.

21. A method, comprising:
    forming a trench/via in a layer of insulating material;
    forming a barrier layer comprised of a barrier layer material and at least two metallic elements comprised of materials other than said barrier layer material; and
    performing at least one heating process to form a plurality of crystalline metal alloy structures comprised of said at least two metallic elements at grain boundaries of said barrier layer.

22. The method of claim 21, further comprising forming a conductive structure in at least said trench/via above said barrier layer comprised of said crystalline metal alloy structures.

23. The method of claim 21, wherein said barrier layer is formed on said layer of insulating material.

24. The method of claim 23, further comprising forming a conductive structure in at least said trench/via on said barrier layer comprised of said crystalline metal alloy structures.

25. The method of claim 21, wherein forming said barrier layer comprises forming a layer of ruthenium, cobalt, tungsten nitride, tantalum, tantalum nitride, molybdenum or rhodium and wherein said at least two metallic elements are selected from the following group: aluminum, manganese, zinc, silver, magnesium, calcium and hafnium.

26. A method, comprising:
    forming a trench/via in a layer of insulating material;
    forming a barrier layer on said layer of insulating material within said trench/via, wherein said barrier layer is comprised of a layer of ruthenium, cobalt, tungsten nitride, tantalum, tantalum nitride, molybdenum or rhodium that contains at least two metallic elements selected from the following group: aluminum, manganese, zinc, silver, magnesium, calcium and hafnium; and performing at least one heating process to form a plurality of crystalline metal alloy structures in said barrier layer, wherein said metal alloy is comprised of said at least two metallic elements at grain boundaries of said barrier layer.

27. The method of claim 26, further comprising forming a conductive structure in at least said trench/via above said barrier layer comprised of said crystalline metal alloy structures.

\* \* \* \* \*